(12) United States Patent
Wu et al.

(10) Patent No.: US 10,529,719 B2
(45) Date of Patent: Jan. 7, 2020

(54) SEMICONDUCTOR STRUCTURE AND FABRICATION METHOD THEREOF

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Po-Han Wu, Pingtung County (TW); Li-Wei Feng, Kaohsiung (TW); Shih-Han Hung, Kaohsiung (TW); Fu-Che Lee, Taichung (TW); Chien-Cheng Tsai, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/961,827

(22) Filed: Apr. 24, 2018

(65) Prior Publication Data
US 2019/0296019 A1    Sep. 26, 2019

(30) Foreign Application Priority Data
Mar. 22, 2018   (CN) .......................... 2018 1 0239010

(51) Int. Cl.
*H01L 27/108*    (2006.01)
*H01L 21/768*    (2006.01)

(52) U.S. Cl.
CPC .. *H01L 27/10814* (2013.01); *H01L 21/76897* (2013.01); *H01L 27/10823* (2013.01);
(Continued)

(58) Field of Classification Search
CPC ......... H01L 21/76897; H01L 21/10823; H01L 21/10855; H01L 21/10876;
(Continued)

(56) References Cited

U.S. PATENT DOCUMENTS 9,165,934 B2    10/2015   Choi
2005/0164448 A1*  7/2005  Okonogi ............. H01L 21/2652
                                                          438/253
(Continued)

OTHER PUBLICATIONS

Po Han Wu et al., "DRAM cost-efficiency SC flatness process without CMP and PREB approach", Invention Disclosure, Jul. 20, 2017, pp. 1-12.

*Primary Examiner* — Patricia D Reddington
(74) *Attorney, Agent, or Firm* — Winston Hsu

(57) ABSTRACT

A semiconductor structure includes an active area in a substrate, a device isolation region surrounding the active area, first and second bit line structures on the substrate, a conductive diffusion region in the active area between the first and the second bit line structures, and a contact hole between the first and the second bit line structures. The contact hole partially exposes the conductive diffusion region. A buried plug layer is disposed in the contact hole and in direct contact with the conductive diffusion region. A storage node contact layer is disposed on the buried plug layer within the contact hole. The storage node contact layer has a downwardly protruding portion surrounded by the buried plug layer. The buried plug layer has a U-shaped cross-sectional profile.

8 Claims, 7 Drawing Sheets

(52) U.S. Cl.
CPC .. *H01L 27/10855* (2013.01); *H01L 27/10876* (2013.01); *H01L 21/76877* (2013.01); *H01L 27/10844* (2013.01)

(58) Field of Classification Search
CPC ......... H01L 27/10814; H01L 27/10823; H01L 27/10855; H01L 27/10876; H01L 27/10844; H01L 21/76877
See application file for complete search history.

(56) References Cited

U.S. PATENT DOCUMENTS

| | | | | |
|---|---|---|---|---|
| 2009/0212370 | A1* | 8/2009 | Ikei | H01L 21/76897 257/368 |
| 2013/0264621 | A1* | 10/2013 | Nishi | H01L 27/10826 257/296 |
| 2014/0110851 | A1* | 4/2014 | Kim | H01L 27/10885 257/773 |
| 2015/0014759 | A1* | 1/2015 | Lee | H01L 23/5329 257/306 |
| 2015/0079757 | A1* | 3/2015 | Jeon | H01L 21/0337 438/396 |
| 2016/0172364 | A1* | 6/2016 | Kim | H01L 21/26506 438/586 |
| 2016/0300763 | A1 | 10/2016 | Kim | |
| 2016/0365279 | A1 | 12/2016 | Koo | |
| 2017/0125283 | A1 | 5/2017 | Lee | |

* cited by examiner

SEMICONDUCTOR STRUCTURE AND FABRICATION METHOD THEREOF

BACKGROUND OF THE INVENTION

1. Field of the Invention

The present invention relates to a semiconductor structure, and more particularly to a dynamic random access memory (DRAM) structure and a manufacturing method thereof.

2. Description of the Prior Art

Higher integration of semiconductor memory devices may help to satisfy consumer demands for superior performance and inexpensive prices. In the case of semiconductor memory devices, increased integration is desired.

A variety of studies on new technology have been conducted to increase the density of semiconductor memory devices. However, the process difficulties caused by the reduction in the critical dimensions and line width of the devices still need to be further overcome.

SUMMARY OF THE INVENTION

The invention provides a semiconductor structure and a manufacturing method thereof to solve the shortcomings of the prior art.

One embodiment of the present invention discloses a semiconductor structure including a substrate, active areas in the substrate, a device isolation region surrounding the active areas, a first bit line structure on the substrate, and a second bit line structure in parallel to and adjacent to the first bit line structure on the substrate. A conductive diffusion area is located on the active areas and between the first bit line structure and the second bit line structure. A contact hole is located between the first bit line structure and the second bit line structure. The contact hole exposes a part of the conductive diffusion region. A buried plug layer is disposed in the contact hole and is in direct contact with the conductive diffusion region. A storage node contact layer is embedded in the contact hole. The storage node contact layer is disposed on the buried plug layer. The storage node contact layer includes a downwardly protruding portion surrounded by the buried plug layer. The buried plug layer has a U-shaped cross-sectional profile.

According to another aspect of the invention, a method for fabricating a semiconductor structure is provided. First, a substrate is prepared. The substrate has thereon an active area, a device isolation region surrounding the active area, a first bit line structure, a second bit line structure in proximity to the first bit line structure, and a conductive diffusion region in the active area between the first bit line structure and the second bit line structure. A contact hole is formed between the first bit line structure and the second bit line structure. The contact hole partially exposes the conductive diffusion region. A plug layer is deposited within the contact hole and a void is formed at a bottom of the contact hole. The plug layer is etched until the void is opened, thereby forming a buried plug layer at a bottom of the contact hole. The buried plug layer has a U-shaped cross-sectional profile.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Figure 1:
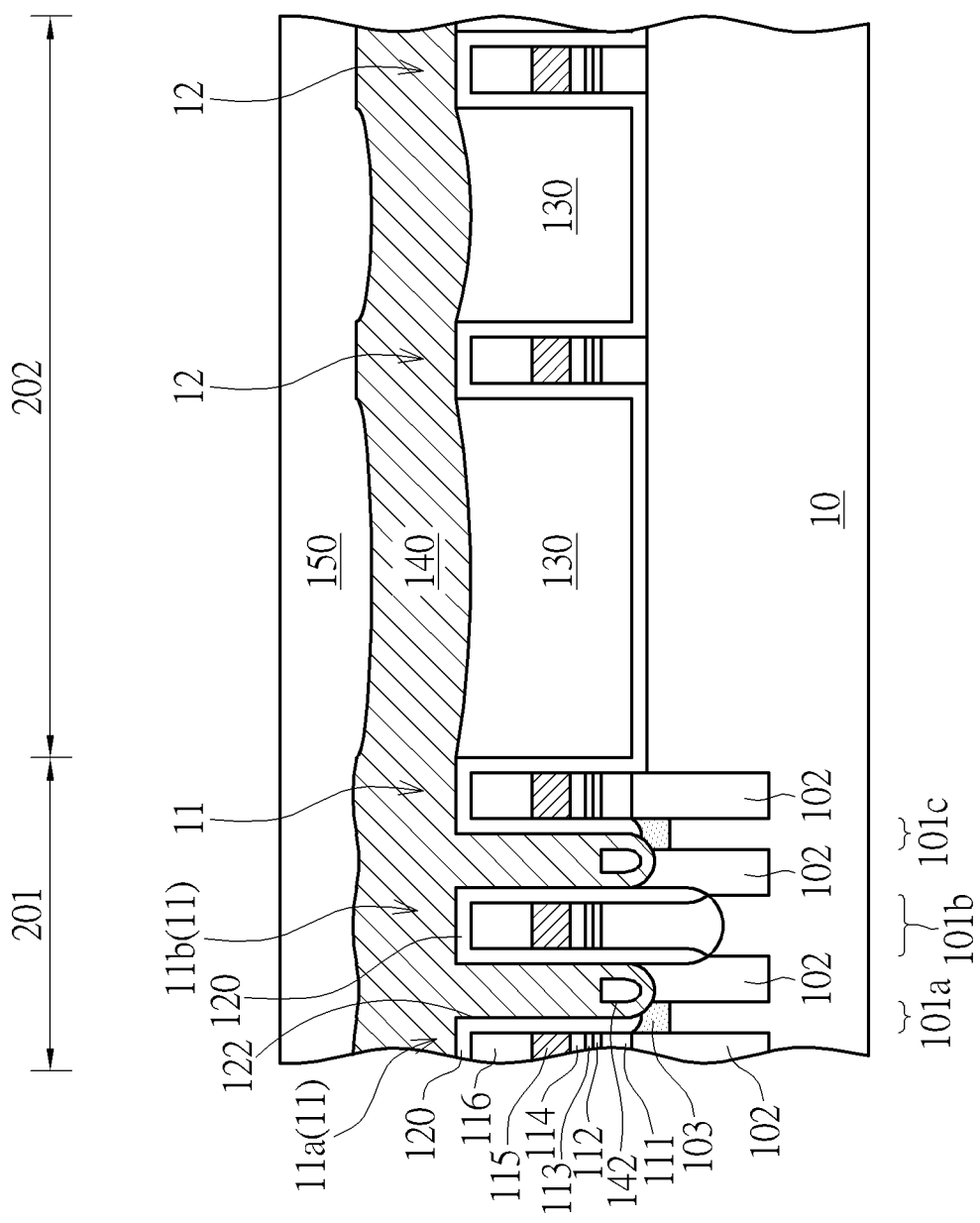
FIG. 1 to FIG. 5 are schematic, cross-sectional views showing a method for fabricating a semiconductor structure according to an embodiment of the present invention.

Please refer to FIG. 1 to FIG. 5, which are schematic, cross-sectional views showing a method for fabricating a semiconductor structure according to an embodiment of the present invention. As shown in FIG. 1, a substrate 10, such as a semiconductor substrate, is first provided. In FIG. 1, the substrate 10 can be divided into a memory array region 201 and a peripheral circuit region 202. In the memory array region 201, the substrate 10 has active areas 101a-101c and a device isolation region 102 surrounding the active areas 101a-101c.

According to an embodiment of the present invention, a plurality of bit lines 11 are formed on the substrate 10 in the memory array area 201, including a first bit line structure 11a and a second bit line structure 11b that is in close proximity to the first bit line structure 11a. In addition, the substrate 10 in the memory array area 201 may further include a conductive diffusion region 103 located in the active area 101a and between the first bit line structure 11a and the second bit line structure 11b.

According to an embodiment of the present invention, gate structures 12 may be formed in the peripheral circuit region 202, but it is not limited thereto.

According to an embodiment of the present invention, both of the first bit line structure 11a and the second bit line structure 11b have a stack structure, for example, a polysilicon layer 111, a titanium (Ti) layer 112, a titanium nitride (TiN) layer 113, a tungsten nitride (WN) layer 114, a tungsten (W) layer 115, and a dielectric cap layer 116 are sequentially included from bottom to top. According to an embodiment of the present invention, the dielectric cap layer 116 may include silicon nitride, but is not limited thereto.

According to an embodiment of the present invention, a conformal liner layer 120 may be disposed on the upper surface and sidewalls of the first bit line structure 11a and the second bit line structure 11b in the memory array region 201.

According to an embodiment of the present invention, an interlayer dielectric layer 130 between the first bit line structure 11a and the second bit line structure 11b in the memory array region 201 has been removed, thus forming a contact hole 122. According to an embodiment of the present invention, the contact hole 122 exposes part of the conductive diffusion region 103. In the peripheral circuit region 202, the interlayer dielectric layer 130 still remains between the gate structures 12.

As can be seen from FIG. 1, a dishing phenomenon occurs on the upper surface of the interlayer dielectric layer 130 in the peripheral circuit area 202 near the memory array region 201. According to an embodiment of the present invention, the interlayer dielectric layer 130 may comprise a silicon oxygen layer, but it is not limited thereto.

Then, a plug layer 140 is deposited in a blanket manner. For example, the contact hole 122 may be filled with the plug layer 140 by a chemical vapor deposition (CVD) process, and a void 142 is formed at the bottom of the contact hole 122. According to an embodiment of the present invention, the upper edge of the void 142 may be lower than the bottom surface of the tungsten layer 115 of the first bit line structure 11a or the second bit line structure 11b. According to an embodiment of the present invention, the plug layer 140 may include a phosphorus doped polysilicon.

According to an embodiment of the present invention, a planarization layer 150 may be subsequently deposited on the plug layer 140. For example, the planarization layer 150 may be an organic dielectric layer. At this point, the thickness of the dielectric cap layer 116 of the first bit line structure 11a and the second bit line structure 11b is about 1100 angstroms (Å).

Figure 2:
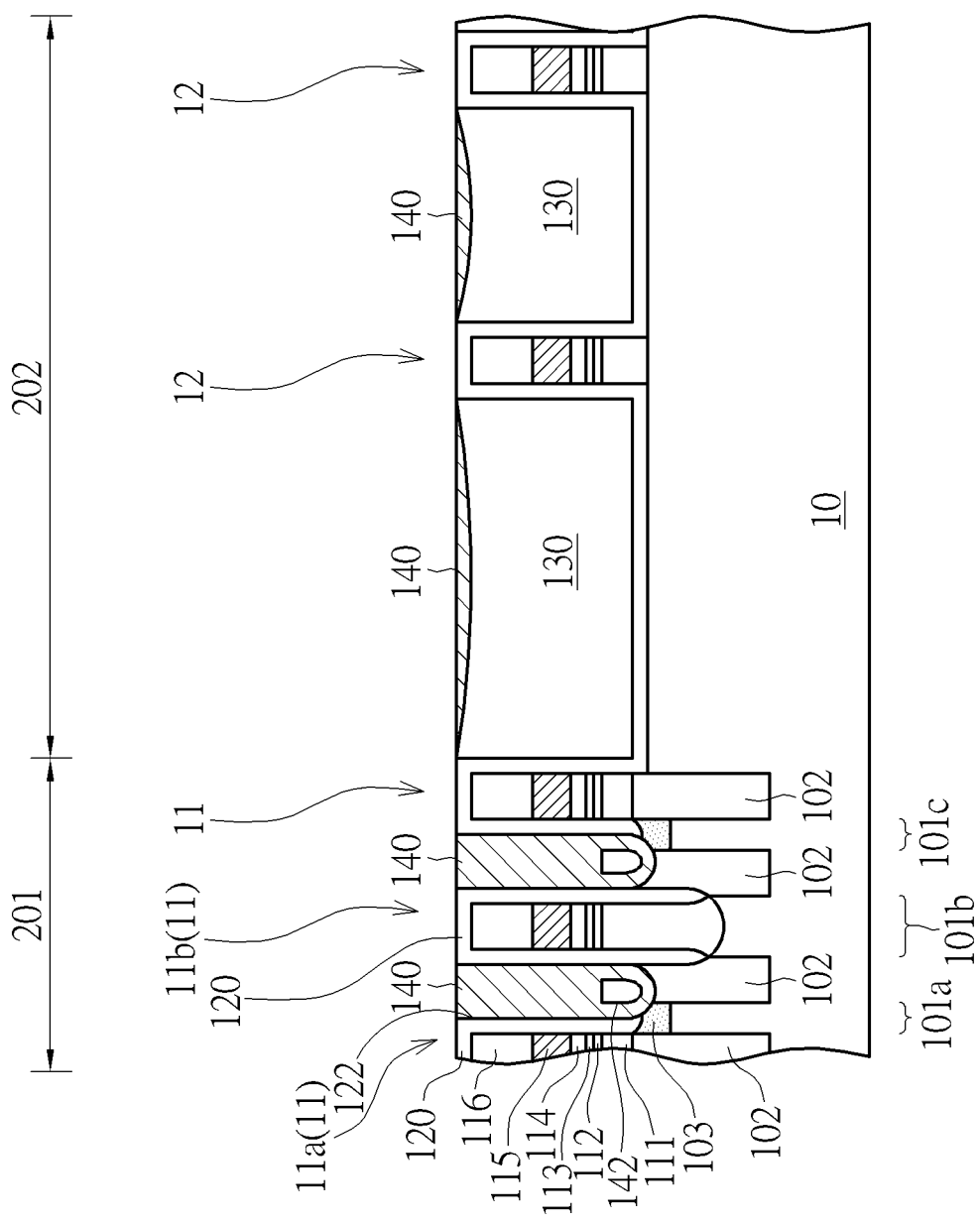

As shown in FIG. 2, a first etch-back process is then performed to etch the planarization layer 150 and the plug layer 140 at approximately the same etching rate until the liner layer 120 on the first bit line structure 11a and the second bit line structure 11b is exposed. At this point, there is still a part of the plug layer 140 remaining on the upper surface of the interlayer dielectric layer 130 in the peripheral circuit region 202.

Figure 3:
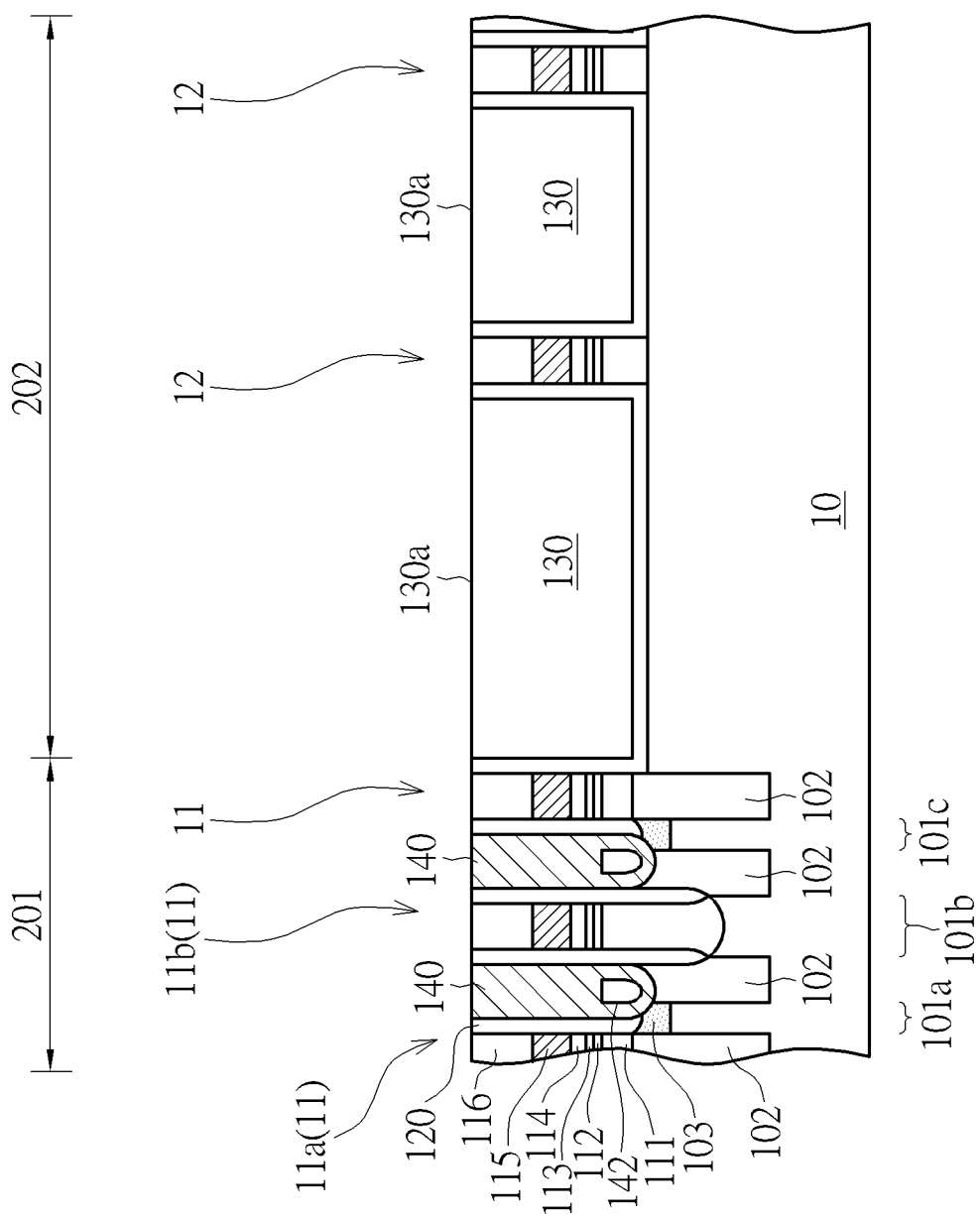

As shown in FIG. 3, a second etch-back process is performed to etch the liner layer 120, the dielectric cap layer 116 of the first bit line structure 11a and the second bit line structure 11b, the plug layer 140 on the upper surface of the interlayer dielectric layer 130 in the peripheral circuit region 202, and the interlayer dielectric layer 130 at approximately the same etching rate. When the etching ceases, the remaining thickness of the dielectric cap layer 116 of the first bit line structure 11a and the second bit line structure 11b is about 800 angstroms.

As can be seen from FIG. 3, at this point, the dishin phenomenon on the upper surface of the interlayer dielectric layer 130 in the peripheral circuit region 202 has been eliminated, and a flat upper surface 130a is present.

Figure 4:
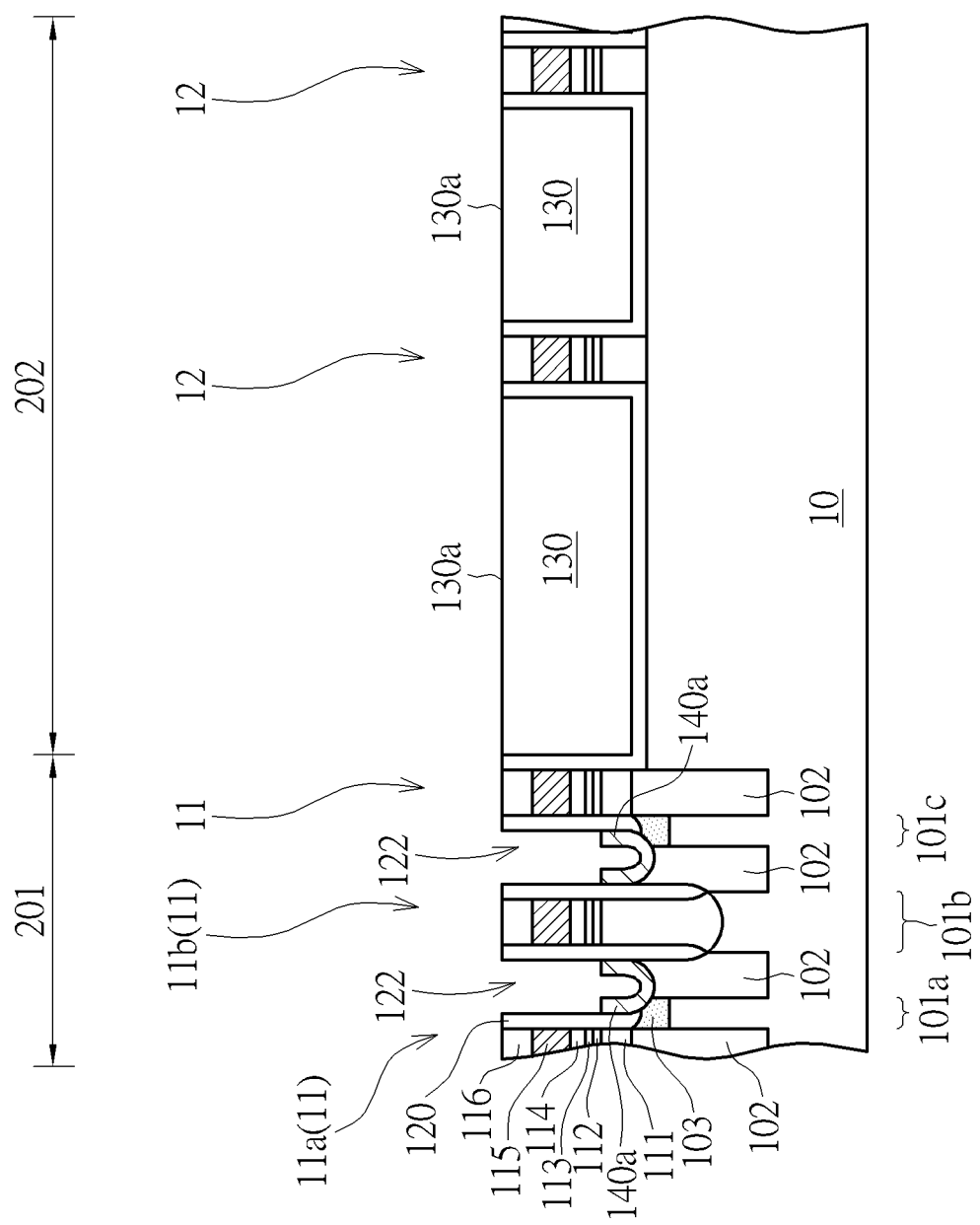

As shown in FIG. 4, next, a recess etching of the plug layer 140 is performed, and part of the plug layer 140 is selectively etched away until the void 142 is opened, thus forming a buried plug layer 140a, which is located at the bottom of the contact hole 122. According to an embodiment of the present invention, the buried plug layer 140a may have a U-shaped cross-sectional profile.

According to an embodiment of the present invention, the position of the buried plug layer 140a is lower than the tungsten layer 115 of the first bit line structure 11a and the second bit line structure 11b. According to an embodiment of the present invention, the buried plug layer 140a is in direct contact with the conductive diffusion region 103. According to an embodiment of the present invention, the upper edge of the buried plug layer 140a is approximately flush with the upper edge of the polysilicon layer 111 of the first bit line structure 11a and the second bit line structure 11b. At this point, the remaining thickness of the dielectric cap layer 116 of the first bit line structure 11a and the second bit line structure 11b is about 700 angstroms.

Figure 5:
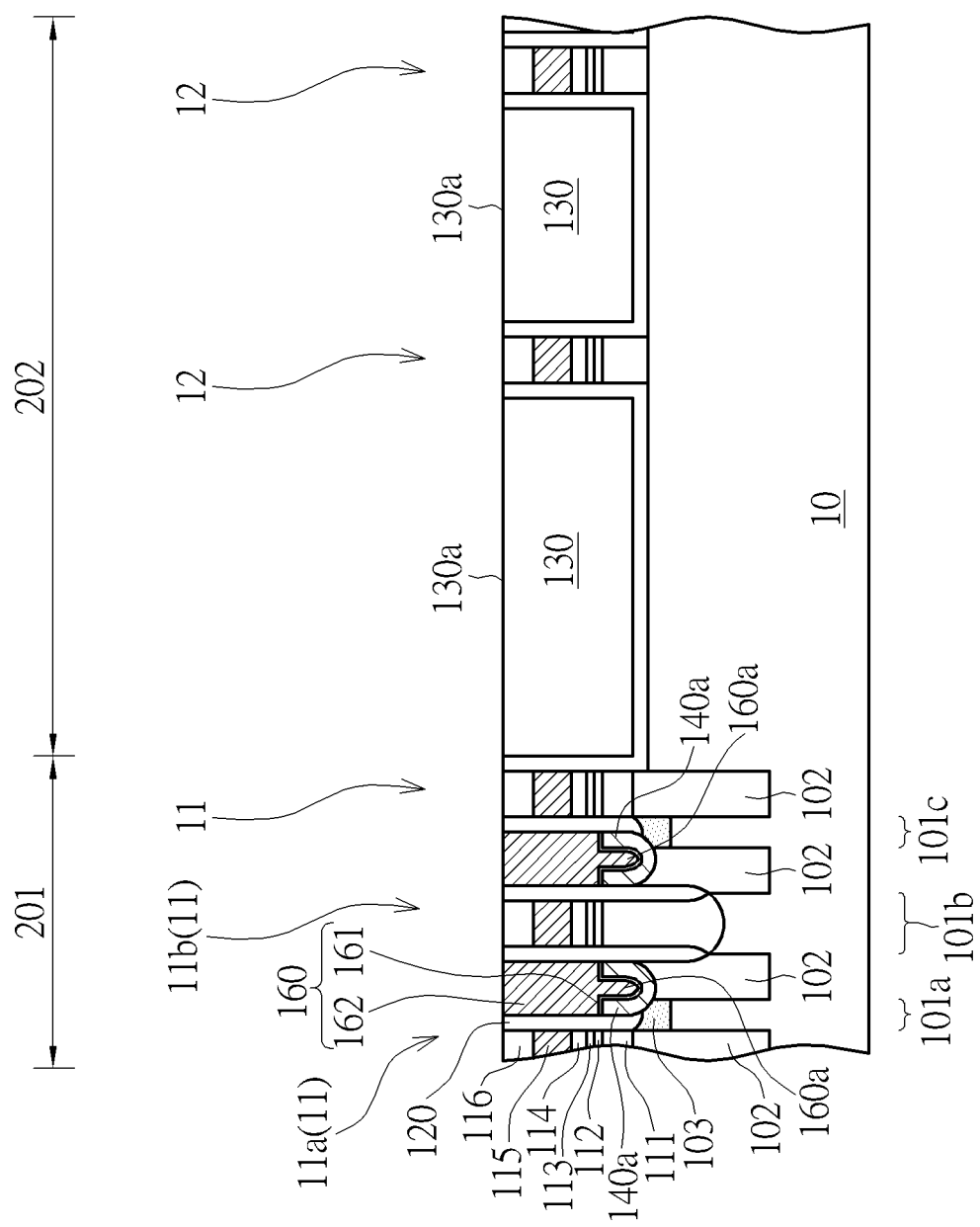

As shown in FIG. 5, a storage node contact layer 160 is then formed on the buried plug layer 140a in the contact hole 122. For example, the method of forming the storage node contact layer 160 may include forming a metal silicide layer 161 in the contact hole 122, and forming a tungsten layer 162 on the metal silicide layer 161. The storage node contact layer 160 fills the U-shaped cross-sectional profile of the buried plug layer 140a, forming a downwardly protruding portion 160a, which is surrounded by the buried plug layer 140a.

Figure 6:
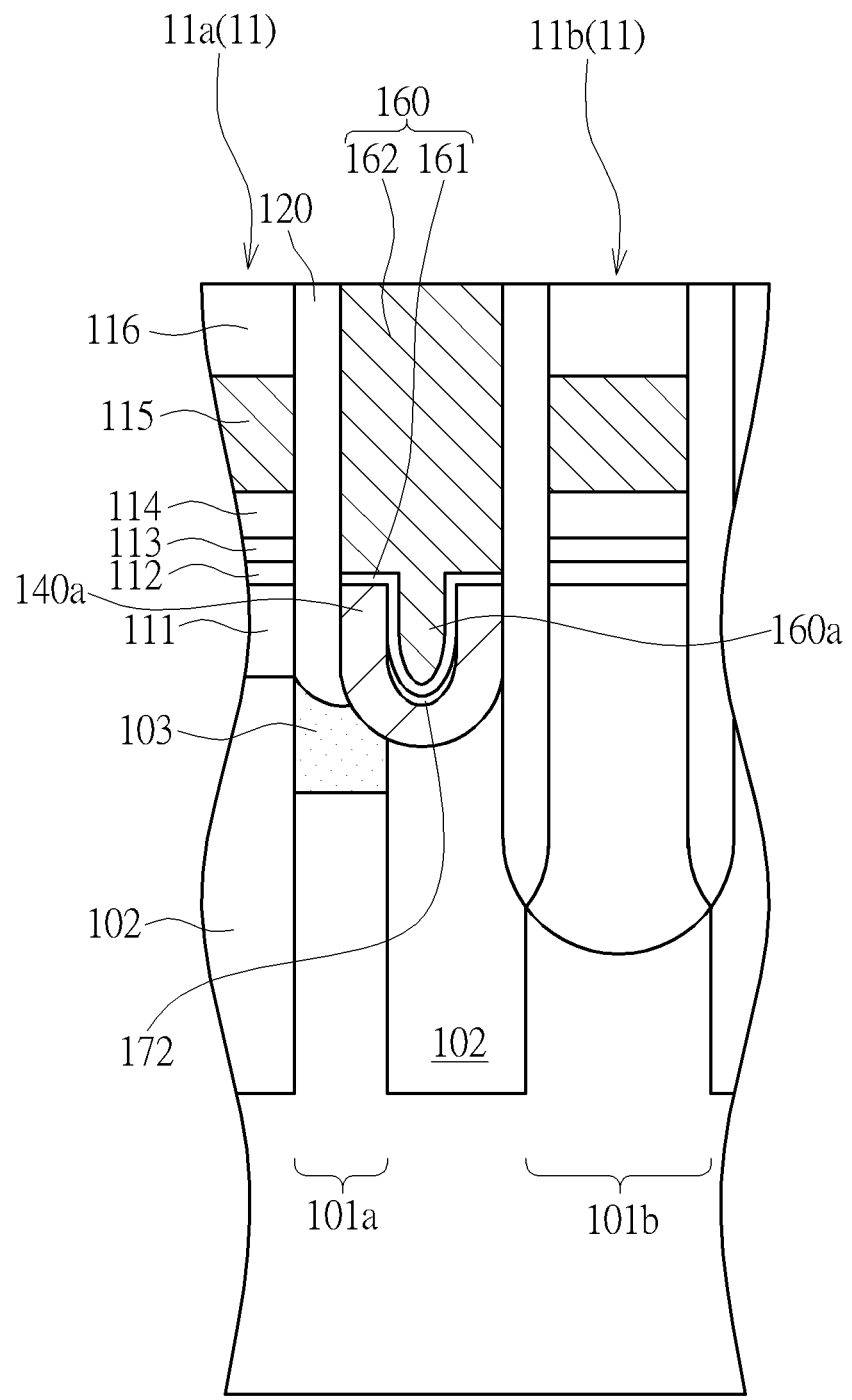
FIG. 6 is an enlarged schematic, cross-sectional view of a contact structure in a memory array region according to another embodiment of the present invention.

Please refer to FIG. 6, which is a schematic enlarged cross-sectional view of a contact structure in the memory array region 201 according to another embodiment of the present invention. As shown in FIG. 6, a gap 172 may be formed between the buried plug layer 140a and the metal silicide layer 161.

Structurally, as shown in FIG. 5 or FIG. 6, the semiconductor structure of the present invention includes a substrate 10; active areas 101a, 101b in the substrate 10; a device isolation region 102 surrounding the active areas 101a, 101b; a first bit line structure 11a on the substrate 10, and a second bit line structure 11b in parallel to and adjacent to the first bit line structure 11a on the substrate 10. A conductive diffusion area 103 is located on the active areas 101a, 101b and between the first bit line structure 11a and the second bit line structure 11b. A contact hole 122 is located between the first bit line structure 11a and the second bit line structure 11b. The contact hole 122 exposes a part of the conductive diffusion region 103. A buried plug layer 140a is disposed in the contact hole 122 and is in direct contact with the conductive diffusion region 103. A storage node contact layer 160 is embedded in the contact hole 122. The storage node contact layer 160 is disposed on the buried plug layer 140a. The storage node contact layer 160 includes a downwardly protruding portion 160a surrounded by the buried plug layer 140a. The buried plug layer 140a has a U-shaped cross-sectional profile.

Figure 7:
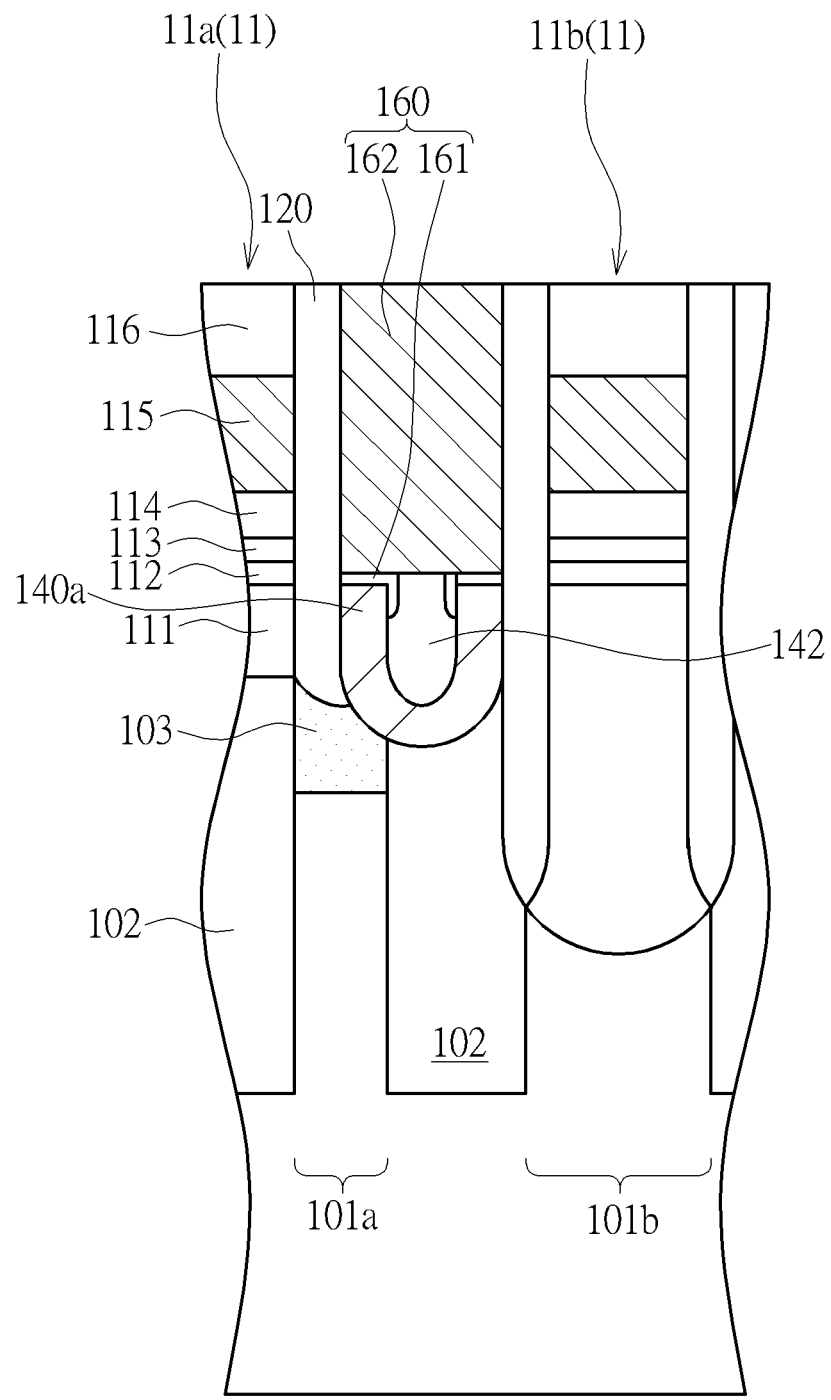
FIG. 7 is an enlarged schematic, cross-sectional view of a contact structure in a memory array region according to another embodiment of the present invention.

Please refer to FIG. 7, which is a schematic enlarged cross-sectional view of the contact structure in the memory array region 201 according to another embodiment of the present invention. The difference between the structure shown in FIG. 7 and the structure shown in FIG. 6 is that the structure shown in FIG. 7 does not form the downward protruding portion 160a after the storage node contact layer 160 is filled, and a void 142 may be formed between the buried plug layer 140a and the storage node contact layer 160. In addition, in the structure shown in FIG. 7, the metal silicide layer 161 is formed on the upper end surface of the buried plug layer 140a and may extend to a part of the sidewall but is not formed at the bottom of the U-shaped cross-sectional profile.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor structure, comprising:
   providing a substrate having thereon an active area, a device isolation region surrounding the active area, a first bit line structure, a second bit line structure in proximity to the first bit line structure, and a conductive diffusion region in the active area between the first bit line structure and the second bit line structure;
   forming a contact hole between the first bit line structure and the second bit line structure, wherein the contact hole partially exposes the conductive diffusion region;

depositing a plug layer within the contact hole, wherein the contact hole is completely filled with the plug layer wherein the plug layer has a sealed void at the bottom of the contact hole; and etching back the plug layer until the void is opened, thereby forming a buried plug layer at the bottom of the contact hole, wherein the buried plug layer has a U-shaped cross-sectional profile.

2. The method according to claim 1 further comprising:
forming a metal silicide layer within the contact hole; and
forming a tungsten layer on the metal silicide layer.

3. The method according to claim 2 further comprising:
forming a gap between the metal silicide layer and the buried plug layer.

4. The method according to claim 1, wherein the first bit line structure and the second bit line structure have a stack structure comprising a polysilicon layer and a tungsten layer on the polysilicon layer.

5. The method according to claim 4, wherein the stack structure further comprises a titanium layer between the polysilicon layer and the tungsten layer.

6. The method according to claim 5, wherein the stack structure further comprises a titanium nitride layer between the titanium layer and the tungsten layer.

7. The method according to claim 6, wherein the stack structure further comprises a tungsten nitride layer between the titanium nitride layer and the tungsten layer.

8. The method according to claim 1, wherein the buried plug layer comprises phosphorus doped polysilicon.

* * * * *